(12) United States Patent
Guatta (10) Patent No.: US 10,904,961 B2
(45) Date of Patent: Jan. 26, 2021

(54) METHOD OF CALIBRATING A HIGH POWER AMPLIFIER FOR A RADIO FREQUENCY POWER MEASUREMENT SYSTEM

(71) Applicants: WHIRLPOOL CORPORATION, Benton Harbor, MI (US); Panasonic Corporation, Kadoma (JP)

(72) Inventor: Davide Guatta, Cassinetta (IT)

(73) Assignees: Whirlpool Corporation, Benton Harbor, MI (US); Panasonic Corporation

( * ) Notice: Subject to any disclaimer, the term of this patent is extended or adjusted under 35 U.S.C. 154(b) by 385 days.

(21) Appl. No.: 15/556,004

(22) PCT Filed: Mar. 7, 2016

(86) PCT No.: PCT/US2016/021184
§ 371 (c)(1),
(2) Date: Sep. 6, 2017

(87) PCT Pub. No.: WO2016/144872
PCT Pub. Date: Sep. 15, 2016

(65) Prior Publication Data
US 2018/0049279 A1    Feb. 15, 2018

Related U.S. Application Data

(60) Provisional application No. 62/129,171, filed on Mar. 6, 2015.

(51) Int. Cl.
*H05B 6/64* (2006.01)
*H05B 6/68* (2006.01)
(Continued)

(52) U.S. Cl.
CPC ......... *H05B 6/6467* (2013.01); *G01R 21/133* (2013.01); *H05B 6/664* (2013.01); *H05B 6/686* (2013.01)

(58) Field of Classification Search
USPC ....... 219/709, 746, 748, 750, 702, 716, 756, 219/761, 697; 439/578, 675
See application file for complete search history.

(56) References Cited

U.S. PATENT DOCUMENTS 2,742,612 A    4/1956  Cohn
2,956,143 A   10/1960  Schall
(Continued)

FOREIGN PATENT DOCUMENTS

CN    1523293 A    8/2004
CN    101118425    2/2008
(Continued)

*Primary Examiner* — Quang T Van
(74) *Attorney, Agent, or Firm* — Price Heneveld LLP (57) ABSTRACT

A method for calibrating a set of devices, each device including an amplifying component and a measuring component that outputs a digital signal indicative of radio frequency power detected at the amplifying component, includes selecting a frequency from a set of frequencies; selecting a phase value from a set of phase values; selecting a power level from a set of power levels; setting a subset of the set of devices to output signal of the selected frequency, the selected phase value and the selected power level; measuring a forward power level and a backward power level; processing the measurements of the forward and backward power levels to calibrate the digital signal output from the measuring component of each of the set of devices; and encoding the calibrated digital signal output into non-volatile memory.

18 Claims, 5 Drawing Sheets

(51) Int. Cl.
*H05B 6/66* (2006.01)
*G01R 21/133* (2006.01)

(56) References Cited

U.S. PATENT DOCUMENTS

| | | |
|---|---|---|
| 2,958,754 A | 11/1960 | Hahn |
| 2,981,904 A | 4/1961 | Ajioka et al. |
| 3,260,832 A | 7/1966 | Johnson |
| 3,265,995 A | 8/1966 | Hamasaki |
| 3,430,023 A | 2/1969 | Tingley |
| 3,440,385 A | 4/1969 | Smith |
| 3,489,135 A | 1/1970 | Astrella |
| 3,536,129 A | 10/1970 | White |
| 3,639,717 A | 2/1972 | Mochizuki |
| 3,731,035 A | 5/1973 | Jarvis et al. |
| 3,737,812 A | 6/1973 | Gaudio et al. |
| 3,812,316 A | 5/1974 | Milburn |
| 4,000,390 A | 12/1976 | Graff |
| 4,088,861 A | 5/1978 | Zwillinger |
| D248,607 S | 7/1978 | Yamamura et al. |
| 4,101,750 A | 7/1978 | Doner |
| 4,107,502 A | 8/1978 | Tanaka et al. |
| 4,136,271 A | 1/1979 | Tanaka et al. |
| 4,139,828 A | 2/1979 | Commault et al. |
| 4,143,646 A | 3/1979 | Sampsel et al. |
| 4,166,207 A | 8/1979 | Burke |
| 4,196,332 A | 1/1980 | MacKay et al. |
| 4,264,800 A | 4/1981 | Jahnke et al. |
| 4,283,614 A | 8/1981 | Tanaka et al. |
| 4,321,445 A | 3/1982 | Kristof et al. |
| 4,354,562 A | 10/1982 | Newman |
| 4,374,319 A | 2/1983 | Guibert |
| D268,079 S | 3/1983 | Miyake et al. |
| 4,463,324 A | 7/1984 | Rolfs |
| D275,546 S | 9/1984 | Tanaka et al. |
| D276,122 S | 10/1984 | Tanaka et al. |
| D277,355 S | 1/1985 | Miyake et al. |
| 4,595,827 A | 6/1986 | Hirai et al. |
| D285,893 S | 9/1986 | Mizuma et al. |
| 4,628,351 A | 12/1986 | Heo |
| 4,673,800 A | 6/1987 | Hirai et al. |
| 4,703,151 A | 10/1987 | Sakamoto |
| 4,743,728 A | 5/1988 | Nagafusa et al. |
| D297,698 S | 9/1988 | Nishikawa et al. |
| D297,800 S | 9/1988 | Feil et al. |
| 4,786,774 A | 11/1988 | Kaminaka |
| D303,063 S | 8/1989 | Satake |
| 4,870,238 A | 9/1989 | Hodgetts et al. |
| 4,886,046 A | 12/1989 | Welch et al. |
| 4,937,413 A | 6/1990 | Spruytenburg et al. |
| 4,999,459 A | 3/1991 | Smith et al. |
| 5,075,525 A | 12/1991 | Jung |
| D330,144 S | 10/1992 | Takebata et al. |
| 5,369,254 A | 11/1994 | Kwon |
| D353,511 S | 12/1994 | Saimen |
| 5,483,045 A | 1/1996 | Gerling |
| 5,546,927 A | 8/1996 | Lancelot |
| 5,558,800 A | 9/1996 | Page |
| D378,723 S | 4/1997 | Weiss |
| 5,619,983 A | 4/1997 | Smith |
| D385,155 S | 10/1997 | Weiss et al. |
| 5,735,261 A | 4/1998 | Kieslinger |
| 5,831,253 A | 11/1998 | Han et al. |
| 5,878,910 A | 3/1999 | Gibernau et al. |
| D411,074 S | 6/1999 | Sakai et al. |
| 5,919,389 A | 7/1999 | Uehashi et al. |
| 5,928,540 A | 7/1999 | Antoine et al. |
| 5,973,305 A | 10/1999 | Kim et al. |
| 5,981,929 A | 11/1999 | Maeda et al. |
| 6,018,158 A | 1/2000 | Kang |
| 6,054,696 A | 4/2000 | Lewis et al. |
| 6,057,535 A | 5/2000 | Derobert et al. |
| 6,097,019 A | 8/2000 | Lewis et al. |
| 6,268,593 B1 | 7/2001 | Sakai |
| 6,359,270 B1 | 3/2002 | Bridson |
| 6,429,370 B1 | 8/2002 | Norte et al. |
| 6,557,756 B1 | 5/2003 | Smith |
| 6,559,882 B1 | 5/2003 | Kerchner |
| 6,575,785 B2 * | 6/2003 | Bohmer ............. H01R 24/44 439/578 |
| D481,582 S | 11/2003 | Seum et al. |
| 6,664,523 B1 | 12/2003 | Kim et al. |
| 6,696,678 B2 | 2/2004 | Hudson et al. |
| D495,556 S | 9/2004 | Milrud et al. |
| 6,853,399 B1 | 2/2005 | Gilman et al. |
| D521,799 S | 5/2006 | Ledingham et al. |
| D522,801 S | 6/2006 | Lee |
| D527,572 S | 9/2006 | Lee et al. |
| 7,105,787 B2 | 9/2006 | Clemen, Jr. |
| 7,111,247 B2 | 9/2006 | Choi et al. |
| D530,973 S | 10/2006 | Lee et al. |
| D531,447 S | 11/2006 | Lee et al. |
| D532,645 S | 11/2006 | Lee |
| 7,193,195 B2 | 3/2007 | Lundstrom et al. |
| D540,105 S | 4/2007 | Lee et al. |
| D540,613 S | 4/2007 | Jeon |
| D550,024 S | 9/2007 | Jeon |
| 7,361,871 B2 | 4/2008 | Cho et al. |
| D568,675 S | 5/2008 | Kawata |
| 7,476,828 B2 | 1/2009 | Genua |
| 7,482,562 B2 | 1/2009 | Song et al. |
| D586,619 S | 2/2009 | Pino et al. |
| D587,959 S | 3/2009 | Hensel |
| 7,556,033 B2 | 7/2009 | Kim |
| D602,306 S | 10/2009 | Lavy |
| 7,770,985 B2 | 8/2010 | Davis et al. |
| D625,557 S | 10/2010 | Pino et al. |
| D626,370 S | 11/2010 | Baek |
| 7,919,735 B2 | 4/2011 | Kiyono et al. |
| 7,926,313 B2 | 4/2011 | Schenkl et al. |
| D638,249 S | 5/2011 | Ryan et al. |
| 8,074,637 B2 | 12/2011 | Yamauchi |
| D655,970 S | 3/2012 | De'Longhi |
| D658,439 S | 5/2012 | Curtis et al. |
| D662,759 S | 7/2012 | Blacken et al. |
| D663,156 S | 7/2012 | Curtis et al. |
| D670,529 S | 11/2012 | Hensel |
| D673,000 S | 12/2012 | De'Longhi |
| D673,418 S | 1/2013 | Lee et al. |
| D678,711 S | 3/2013 | Reiner |
| 8,389,916 B2 | 3/2013 | Ben-Shmuel et al. |
| 8,455,803 B2 | 6/2013 | Danzer et al. |
| 8,492,686 B2 | 7/2013 | Bilchinsky et al. |
| 8,530,807 B2 | 9/2013 | Niklasson et al. |
| 8,610,038 B2 | 12/2013 | Hyde et al. |
| 8,745,203 B2 | 6/2014 | McCoy |
| 8,803,051 B2 | 8/2014 | Lee et al. |
| D717,579 S | 11/2014 | Gregory et al. |
| 9,040,879 B2 | 5/2015 | Libman et al. |
| D736,554 S | 8/2015 | Steiner et al. |
| D737,620 S | 9/2015 | Miller et al. |
| D737,622 S | 9/2015 | Miller et al. |
| 9,131,543 B2 | 9/2015 | Ben-Shmuel et al. |
| 9,132,408 B2 | 9/2015 | Einziger et al. |
| 9,179,506 B2 | 11/2015 | Sim et al. |
| 9,210,740 B2 | 12/2015 | Libman et al. |
| 9,215,756 B2 | 12/2015 | Bilchinsky et al. |
| 9,351,347 B2 | 5/2016 | Torres et al. |
| 9,374,852 B2 | 6/2016 | Bilchinsky et al. |
| D769,669 S | 10/2016 | Kim et al. |
| 9,560,699 B2 | 1/2017 | Zhylkov et al. |
| 9,585,203 B2 | 2/2017 | Sadahira et al. |
| 2005/0162335 A1 | 7/2005 | Ishii |
| 2006/0289526 A1 | 12/2006 | Takizaki et al. |
| 2009/0134155 A1 | 5/2009 | Kim et al. |
| 2010/0176121 A1 | 7/2010 | Nobue et al. |
| 2010/0176123 A1 * | 7/2010 | Mihara ............. H05B 6/686 219/746 |
| 2010/0187224 A1 | 7/2010 | Hyde et al. |
| 2011/0031236 A1 | 2/2011 | Ben-Shmuel et al. |
| 2011/0168699 A1 | 7/2011 | Oomori et al. |
| 2011/0290790 A1 | 12/2011 | Sim et al. |
| 2012/0067872 A1 | 3/2012 | Libman et al. |
| 2012/0103972 A1 | 5/2012 | Okajima |

(56) References Cited

U.S. PATENT DOCUMENTS

| | | |
|---|---|---|
| 2012/0152939 A1 | 6/2012 | Nobue et al. |
| 2012/0160830 A1 | 6/2012 | Bronstering |
| 2013/0048881 A1 | 2/2013 | Einziger et al. |
| 2013/0080098 A1 | 3/2013 | Hadad et al. |
| 2013/0142923 A1 | 6/2013 | Torres et al. |
| 2013/0156906 A1 | 6/2013 | Raghavan et al. |
| 2013/0186887 A1 | 7/2013 | Hallgren et al. |
| 2013/0200066 A1 | 8/2013 | Gelbart et al. |
| 2013/0277353 A1 | 10/2013 | Joseph et al. |
| 2014/0197161 A1 | 7/2014 | Dobie |
| 2014/0203012 A1 | 7/2014 | Corona et al. |
| 2014/0208957 A1 | 7/2014 | Imai et al. |
| 2014/0277100 A1 | 9/2014 | Kang |
| 2015/0034632 A1 | 2/2015 | Brill et al. |
| 2015/0070029 A1 | 3/2015 | Libman et al. |
| 2015/0136758 A1 | 5/2015 | Yoshino et al. |
| 2015/0156827 A1 | 6/2015 | Ibragimov et al. |
| 2015/0173128 A1 | 6/2015 | Hosokawa et al. |
| 2015/0271877 A1 | 9/2015 | Johansson |
| 2015/0289324 A1 | 10/2015 | Rober et al. |
| 2015/0305095 A1 | 10/2015 | Huang et al. |
| 2015/0334788 A1 | 11/2015 | Hofmann et al. |
| 2015/0373789 A1 | 12/2015 | Meusburger et al. |
| 2016/0029442 A1 | 1/2016 | Houbloss et al. |
| 2016/0088690 A1 | 3/2016 | Kubo et al. |
| 2016/0119982 A1 | 4/2016 | Kang et al. |
| 2016/0219656 A1 | 7/2016 | Hunter, Jr. |
| 2016/0327281 A1 | 11/2016 | Bhogal et al. |
| 2016/0353528 A1 | 12/2016 | Bilchinsky et al. |
| 2016/0353529 A1 | 12/2016 | Omori et al. |
| 2017/0099988 A1 | 4/2017 | Matloubian et al. |
| 2017/0105572 A1 | 4/2017 | Matloubian et al. |

FOREIGN PATENT DOCUMENTS

| | | |
|---|---|---|
| CN | 201081287 Y | 7/2008 |
| CN | 102012051 A | 4/2011 |
| CN | 102620324 A | 8/2012 |
| CN | 103156532 A | 6/2013 |
| CN | 203025135 U | 6/2013 |
| CN | 105042654 A | 11/2015 |
| CN | 204987134 U | 1/2016 |
| CN | 106103555 A | 11/2016 |
| DE | 3238441 A1 | 4/1984 |
| DE | 102004002466 A1 | 8/2005 |
| DE | 102008042467 A1 | 4/2010 |
| EP | 0199264 A2 | 10/1986 |
| EP | 0493623 A1 | 8/1992 |
| EP | 1193584 | 3/2002 |
| EP | 1424874 A2 | 6/2004 |
| EP | 1426692 A2 | 6/2004 |
| EP | 1471773 A2 | 10/2004 |
| EP | 1732359 A2 | 12/2006 |
| EP | 1795814 | 6/2007 |
| EP | 1970631 A2 | 9/2008 |
| EP | 2031938 A1 | 3/2009 |
| EP | 2205043 A1 | 7/2010 |
| EP | 2230463 A1 | 9/2010 |
| EP | 2220913 B1 | 5/2011 |
| EP | 2512206 A1 | 10/2012 |
| EP | 2405711 A2 | 11/2012 |
| EP | 2618634 A1 | 7/2013 |
| EP | 2775794 A1 | 9/2014 |
| EP | 2906021 A1 | 8/2015 |
| EP | 2393339 B1 | 12/2016 |
| FR | 2766272 A1 | 1/1999 |
| FR | 2976651 A | 12/2012 |
| GB | 639470 A | 6/1950 |
| GB | 1424888 | 2/1976 |
| GB | 2158225 A | 11/1985 |
| GB | 2193619 A | 2/1988 |
| GB | 2367196 A | 3/2002 |
| JP | 355155120 A | 12/1980 |
| JP | 57194296 U | 12/1982 |
| JP | 59226497 A | 12/1984 |
| JP | H0510527 A | 1/1993 |
| JP | 106147492 A | 5/1994 |
| JP | 8-171986 | 7/1996 |
| JP | 2000304593 A | 11/2000 |
| JP | 2008108491 A | 5/2008 |
| JP | 2011146143 A | 7/2011 |
| JP | 2013073710 A | 4/2013 |
| KR | 2050002121 | 7/2005 |
| KR | 101359460 B1 | 2/2014 |
| KR | 20160093858 A | 8/2016 |
| RU | 2122338 C1 | 11/1998 |
| RU | 2215380 C2 | 10/2003 |
| RU | 2003111214 A | 11/2004 |
| RU | 2003122979 A | 2/2005 |
| RU | 2008115817 A | 10/2009 |
| RU | 2008137844 A | 3/2010 |
| WO | 8807805 A1 | 10/1988 |
| WO | 0036880 | 6/2000 |
| WO | 02065036 A1 | 8/2002 |
| WO | 03077601 A1 | 9/2003 |
| WO | 2008018466 A1 | 2/2008 |
| WO | 2008102360 A2 | 8/2008 |
| WO | 2009039521 A1 | 3/2009 |
| WO | 2011138680 A2 | 11/2011 |
| WO | 2012001523 A2 | 1/2012 |
| WO | 2012162072 | 11/2012 |
| WO | 2011039961 A1 | 2/2013 |
| WO | 2014188422 A2 | 11/2014 |
| WO | 2015024177 A1 | 2/2015 |
| WO | 2015099648 A1 | 7/2015 |
| WO | 2015099650 A1 | 7/2015 |
| WO | 2015099651 A1 | 7/2015 |
| WO | 2016128088 A1 | 8/2016 |
| WO | 2017190792 A1 | 11/2017 |

* cited by examiner

METHOD OF CALIBRATING A HIGH POWER AMPLIFIER FOR A RADIO FREQUENCY POWER MEASUREMENT SYSTEM

CROSS-REFERENCE TO RELATED APPLICATION

This application claims the benefit of priority to U.S. Provisional Patent Application No. 62/129,171, filed on Mar. 6, 2015, the disclosure of which is incorporated herein by reference in its entirety.

BACKGROUND

The present device generally relates to a method for calibration of a high power amplifier for a radio frequency power measurement system, and more specifically, to a method for calibration of multiple high power amplifiers for a radio frequency power measurement system of a microwave oven.

A conventional microwave oven cooks food by a process of dielectric heating in which a high-frequency alternating electromagnetic field is distributed throughout an enclosed cavity. A sub-band of the radio frequency spectrum, microwave frequencies at or around 2.45 GHz cause dielectric heating primarily by absorption of energy in water.

To generate microwave frequency radiation in a conventional microwave, a voltage applied to a high-voltage transformer results in a high-voltage power that is applied to a magnetron that generates microwave frequency radiation. The microwaves are then transmitted to an enclosed cavity containing the food through a waveguide. Cooking food in an enclosed cavity with a single, non-coherent source like a magnetron can result in non-uniform heating of the food. To more evenly heat food, microwave ovens include, among other things, mechanical solutions such as a microwave stirrer and a turntable for rotating the food. A common magnetron-based microwave source is not narrowband and not tunable (i.e. emits microwaves at a frequency that is changing over time and not selectable). As an alternative to such a common magnetron-based microwave source, solid-state sources can be included in microwave ovens which are tunable and coherent.

SUMMARY

In one aspect, a method for calibrating a set of devices, each device comprising an amplifying component configured to output a signal that is amplified in power with respect to an input radio frequency signal and a measuring component that outputs a digital signal indicative of radio frequency power detected at the amplifying component is provided. The method includes selecting a frequency from a set of frequencies in a bandwidth of radio frequency electromagnetic waves; selecting a phase value from a set of phase values of radio frequency electromagnetic waves; selecting a power level from a set of power levels); setting a subset of the set of devices to output a radio frequency signal of the selected frequency, the selected phase value and the selected power level; measuring a forward power level for the subset of the set of devices that is outputting the radio frequency signal; measuring a backward power level for a subset of the set of devices that is not outputting the radio frequency signal; processing the measurements of the forward and backward power levels to calibrate the digital signal output from the measuring component of each of the set of devices; and encoding the calibrated digital signal output into non-volatile memory.

In another aspect, an electromagnetic cooking device includes an enclosed cavity; a set of radio frequency (RF) feeds in the enclosed cavity configured to heat up and prepare food by introducing electromagnetic radiation into the enclosed cavity; a set of high-power RF amplifiers coupled to the set of RF feeds and a controller configured to calibrate the electromagnetic cooking device. Each high-power amplifier includes an amplifying component configured to output a signal that is amplified in power with respect to an input radio frequency signal and a measuring component configured to output a digital signal indicative of radio frequency power detected at the amplifying component. The controller is configured to calibrate the electromagnetic cooking device by: selecting a frequency from a set of frequencies in a bandwidth of radio frequency electromagnetic waves; selecting a phase value from a set of phase values of radio frequency electromagnetic waves; selecting a power level from a set of power levels; and setting a subset of the set of high-power amplifiers to output a radio frequency signal of the selected frequency, the selected phase value and the selected power level. The controller is further configured to receive from a power meter: a measurement of a forward power level for the subset of the set of high-power RF amplifiers that is outputting the radio frequency signal; and a measurement of a backward power level for a subset of the set of high-power RF amplifiers that is not outputting the radio frequency signal. The controller is further configured to process the measurements of the forward and backward power levels to calibrate the digital signal output from the measuring component of each of the set of high-power RF amplifiers and encode the calibrated digital signal output into non-volatile memory.

In another aspect, an electromagnetic cooking device includes an enclosed cavity; a set of radio frequency feeds in the enclosed cavity configured to heat up and prepare food by introducing electromagnetic radiation into the enclosed cavity; a set of high-power RF amplifiers coupled to the set of RF feeds, each high-power amplifier comprising an amplifying component configured to output a signal that is amplified in power with respect to an input radio frequency signal and a measuring component configured to output a digital signal indicative of radio frequency power detected at the amplifying component; and a controller configured to calibrate the electromagnetic cooking device by causing selected ones of the set of high-power amplifiers to output a radio frequency signal of a selected frequency, a selected phase value and a selected power level, wherein the selected frequency is selected from a set of frequencies in a bandwidth of radio frequency electromagnetic waves, the selected phase value is selected from a set of phase values of radio frequency electromagnetic waves, and the selected power level is selected from a set of power levels. The controller is further configured to calibrate the electromagnetic cooking device by processing measurements of forward and backward power levels to calibrate the digital signal output from the measuring component of each of the set of high-power RF amplifiers and encode the calibrated digital signal output into non-volatile memory such that a unique set of calibration coefficients are encoded for each of the set of high-power RF amplifiers.

DETAILED DESCRIPTION

It is to be understood that the specific devices and processes illustrated in the attached drawings, and described in the following specification are simply exemplary embodiments of the inventive concepts defined in the appended claims. Hence, other physical characteristics relating to the embodiments disclosed herein are not to be considered as limiting, unless the claims expressly state otherwise.

A solid-state radio frequency (RF) cooking appliance heats up and prepares food by introducing electromagnetic radiation into an enclosed cavity. Multiple RF feeds at different locations in the enclosed cavity produce dynamic electromagnetic wave patterns as they radiate. To control and shape of the wave patterns in the enclosed cavity, the multiple RF feeds can radiate waves with separately controlled electromagnetic characteristics to maintain coherence (that is, a stationary interference pattern) within the enclosed cavity. For example, each RF feed can transmit a different phase and/or amplitude with respect to the other feeds. Other electromagnetic characteristics can be common among the RF feeds. For example, each RF feed can transmit at a common but variable frequency. Although the following embodiments are directed to a cooking appliance where RF feeds direct electromagnetic radiation to heat an object in an enclosed cavity, it will be understood that the methods described herein and the inventive concepts derived herefrom are not so limited. The covered concepts and methods are applicable to any RF device where electromagnetic radiation is directed to an enclosed cavity to act on an object inside the cavity. Exemplary devices include ovens, dryers, steamers, and the like.

Figure 1:
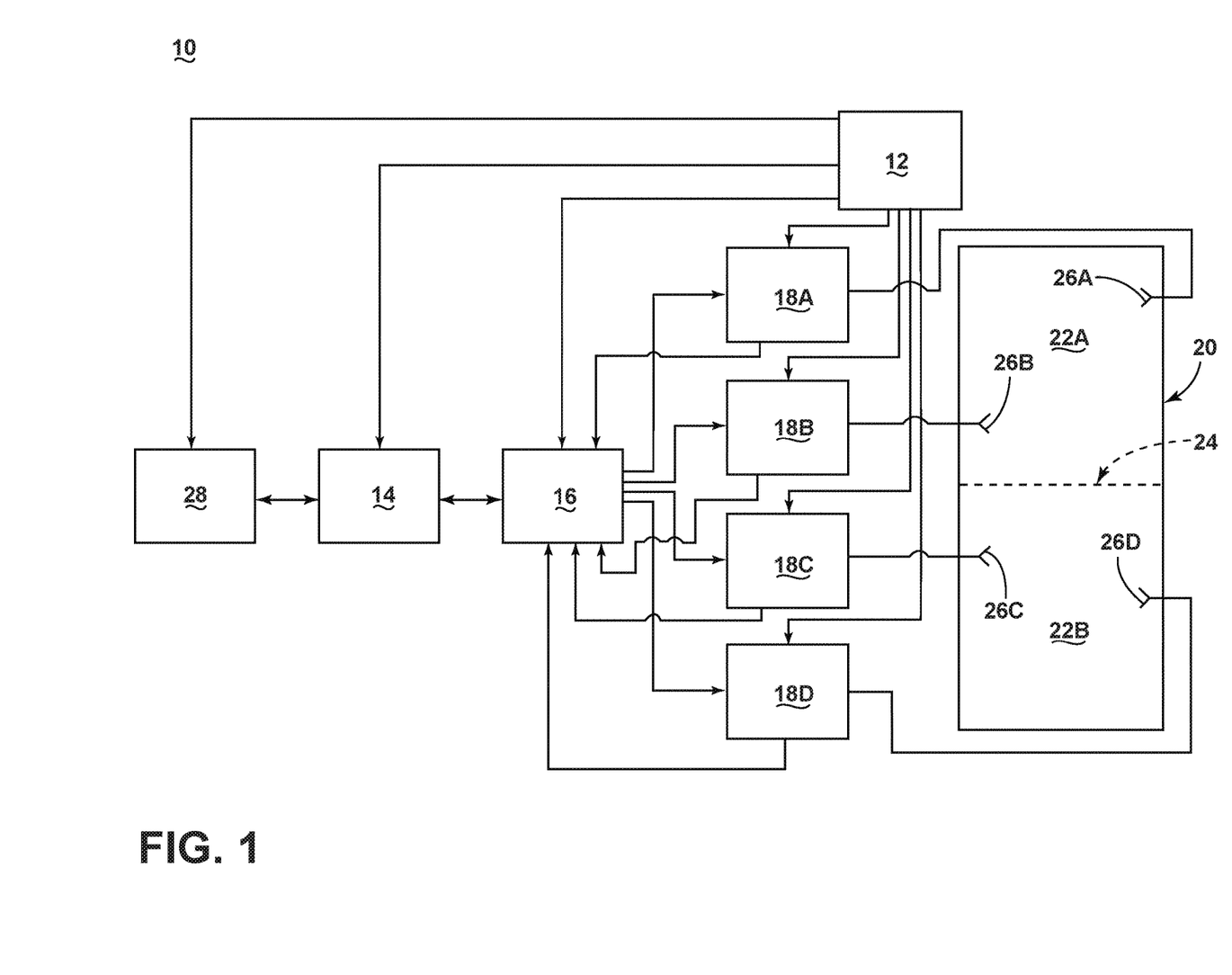
FIG. 1 is a block diagram of an electromagnetic cooking device with multiple coherent radio frequency feeds in accordance with various aspects described herein.

FIG. 1 shows a block diagram of an electromagnetic cooking device 10 with multiple coherent RF feeds 26A-D according to one embodiment. As shown in FIG. 1, the electromagnetic cooking device 10 includes a power supply 12, a controller 14, an RF signal generator 16, a human-machine interface 28 and multiple high-power RF amplifiers 18A-D coupled to the multiple RF feeds 26A-D. The multiple RF feeds 26A-D each couple RF power from one of the multiple high-power RF amplifiers 18A-D into an enclosed cavity 20.

The power supply 12 provides electrical power derived from mains electricity to the controller 14, the RF signal generator 16, the human-machine interface 28 and the multiple high-power RF amplifiers 18A-D. The power supply 12 converts the mains electricity to the required power level of each of the devices it powers. The power supply 12 can deliver a variable output voltage level. For example, the power supply 12 can output a voltage level selectively controlled in 0.5-Volt steps. In this way, the power supply 12 can be configured to typically supply 28 Volts direct current to each of the high-power RF amplifiers 18A-D, but can supply a lower voltage, such as 15 Volts direct current, to decrease an RF output power level by a desired level.

A controller 14 can be included in the electromagnetic cooking device 10, which can be operably coupled with various components of the electromagnetic cooking device 10 to implement a cooking cycle. The controller 14 can also be operably coupled with a control panel or human-machine interface 28 for receiving user-selected inputs and communicating information to a user. The human-machine interface 28 can include operational controls such as dials, lights, switches, touch screen elements, and displays enabling a user to input commands, such as a cooking cycle, to the controller 14 and receive information. The user interface 28 can be one or more elements, which can be centralized or dispersed relative to each other. The controller 14 may also select the voltage level supplied by power supply 12.

The controller 14 can be provided with a memory and a central processing unit (CPU), and can be preferably embodied in a microcontroller. The memory can be used for storing control software that can be executed by the CPU in completing a cooking cycle. For example, the memory can store one or more pre-programmed cooking cycles that can be selected by a user and completed by the electromagnetic cooking device 10. The controller 14 can also receive input from one or more sensors. Non-limiting examples of sensors that can be communicably coupled with the controller 14 include peak level detectors known in the art of RF engineering for measuring RF power levels and temperature sensors for measuring the temperature of the enclosed cavity or one or more of the high-power amplifiers 18A-D.

Based on the user input provided by the human-machine interface 28 and data including the forward and backward (or reflected) power magnitudes coming from the multiple high-power amplifiers 18A-D (represented in FIG. 1 by the path from each of the high-power amplifiers 18A-D through the RF signal generator 16 to the controller 14), the controller 14 can determine the cooking strategy and calculate the settings for the RF signal generator 16. In this way, one of the main functions of the controller 14 is to actuate the electromagnetic cooking device 10 to instantiate the cooking cycle as initiated by the user. The RF signal generator 16 as described below then can generate multiple RF waveforms, that is, one for each high-power amplifier 18A-D based on the settings indicated by the controller 14.

The high-power amplifiers 18A-D, each coupled to one of the RF feeds 26A-D, each output a high power RF signal based on a low power RF signal provided by the RF signal generator 16. The low power RF signal input to each of the high-power amplifiers 18A-D can be amplified by transforming the direct current electrical power provided by the power supply 12 into a high power radio frequency signal. In one non-limiting example, each high-power amplifier 18A-D can be configured to output an RF signal ranging from 50 to 250 Watts. The maximum output wattage for each high-power amplifier can be more or less than 250 Watts depending upon the implementation.

Additionally, each of the high-power amplifiers 18A-D includes a sensing capability to measure the magnitude of the forward and the backward power levels at the amplifier output. The measured backward power at the output of each high-power amplifier 18A-D indicates a power level returned to the high-power amplifier 18A-D as a result of an impedance mismatch between the high-power amplifier 18A-D and the enclosed cavity 20. Besides providing feedback to the controller 14 and the RF signal generator 16 to implement, in part, a cooking strategy, the backward power level can indicate excess reflected power that can damage the high-power amplifier 18A-D.

Consequently, each high-power amplifier 18A-D can include a dummy load to absorb excessive RF reflections. Along with the determination of the backward power level at each of the high-power amplifiers 18A-D, temperature sensing at the high-power amplifier 18A-D including at the dummy load can provide the data necessary to determine if the backward power level has exceeded a predetermined threshold. If the threshold is exceeded, any of the controlling elements in the RF transmission chain including the power supply 12, controller 14, the RF signal generator 16, or the high-power amplifier 18A-D can determine that the high-power amplifier 18A-D can be switched to a lower power level or completely turned off. For example, each high-power amplifier 18A-D can switch itself off automatically if the backward power level or sensed temperature is too high for several milliseconds. Alternatively, the power supply 12 can cut the direct current power supplied to the high-power amplifier 18A-D.

The multiple RF feeds 26A-D couple power from the multiple high-power RF amplifiers 18A-D to the enclosed cavity 20. The multiple RF feeds 26A-D can be coupled to the enclosed cavity 20 in spatially separated but fixed physical locations. The multiple RF feeds 26A-D can be implemented via waveguide structures designed for low power loss propagation of RF signals. In one non-limiting example, metallic, rectangular waveguides known in microwave engineering are capable of guiding RF power from a high-power amplifier 18A-D to the enclosed cavity 20 with a power attenuation of approximately 0.03 decibels per meter.

The enclosed cavity 20 can selectively include subcavities 22A-B by insertion of an optional divider 24 therein. The enclosed cavity 20 can include, on at least one side, a shielded door to allow user access to the interior of the enclosed cavity 20 for placement and retrieval of food or the optional divider 24.

The transmitted bandwidth of each of the RF feeds 26A-D can include frequencies ranging from 2.4 GHz to 2.5 GHz. The RF feeds 26A-D can be configured to transmit other RF bands. For example, the bandwidth of frequencies between 2.4 GHz and 2.5 GHz is one of several bands that make up the industrial, scientific and medical (ISM) radio bands. The transmission of other RF bands is contemplated and can include non-limiting examples contained in the ISM bands defined by the frequencies: 13.553 MHz to 13.567 MHz, 26.957 MHz to 27.283 MHz, 902 MHz to 928 MHz, 5.725 GHz to 5.875 GHz and 24 GHz to 24.250 GHz.

Figure 2:
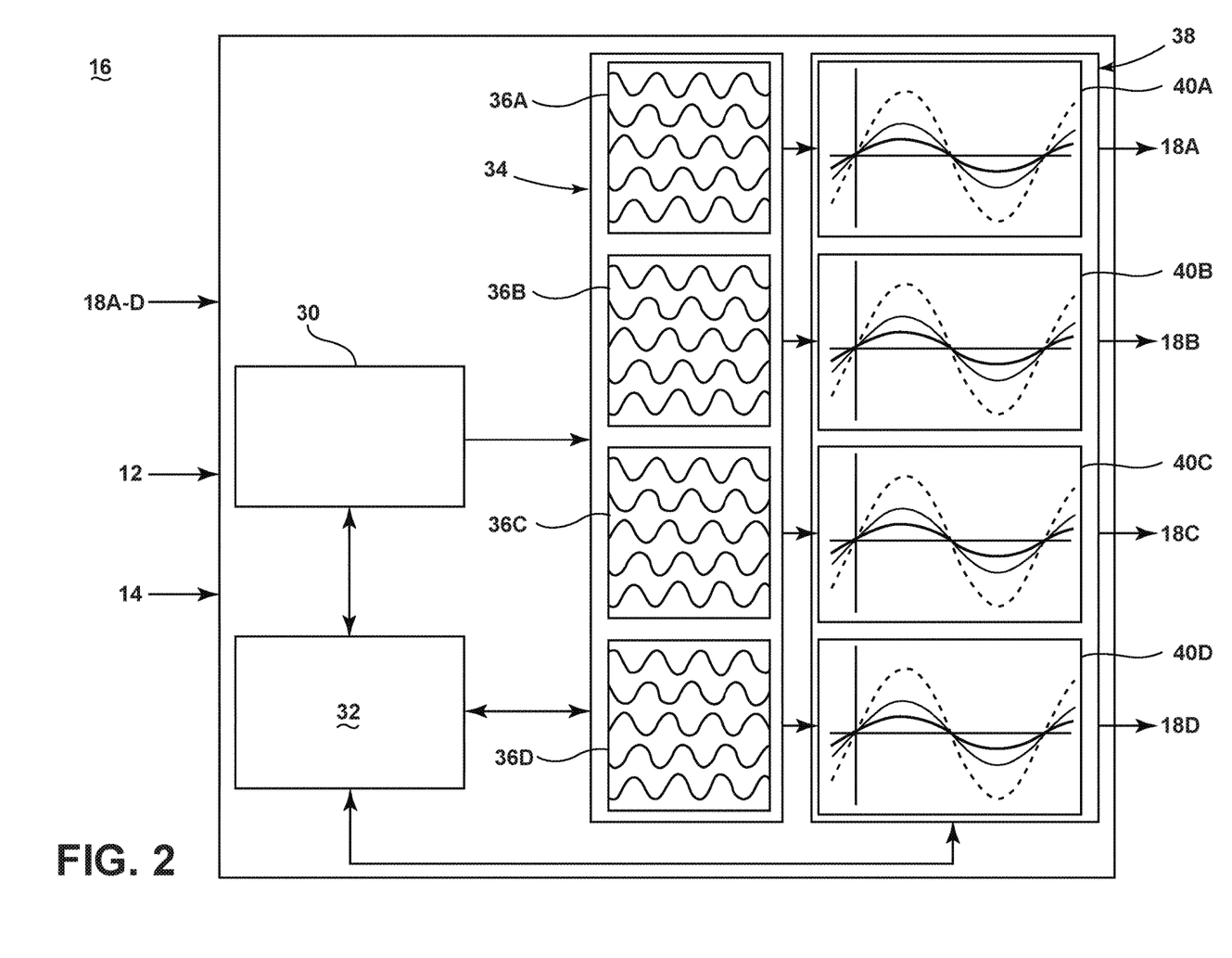
FIG. 2 is a block diagram of a radio frequency signal generator of FIG. 1.

Referring now to FIG. 2, a block diagram of the RF signal generator 16 is shown. The RF signal generator 16 includes a frequency generator 30, a phase generator 34 and an amplitude generator 38 sequentially coupled and all under the direction of an RF controller 32. In this way, the actual frequency, phases and amplitudes to be output from the RF signal generator 16 to the high power amplifiers are programmable through the RF controller 32, preferably implemented as a digital control interface. The RF signal generator 16 can be physically separate from the cooking controller 14 or can be physically mounted onto or integrated into the controller 14. The RF signal generator 16 is preferably implemented as a bespoke integrated circuit.

As shown in FIG. 2 the RF signal generator 16 outputs four RF channels 40A-D that share a common but variable frequency (e.g. ranging from 2.4 GHz to 2.5 GHz), but are settable in phase and amplitude for each RF channel 40A-D. The configuration described herein is exemplary and should not be considered limiting. For example, the RF signal generator 16 can be configured to output more or less channels and can include the capability to output a unique variable frequency for each of the channels depending upon the implementation.

As previously described, the RF signal generator 16 can derive power from the power supply 12 and input one or more control signals from the controller 14. Additional inputs can include the forward and backward power levels determined by the high-power amplifiers 18A-D. Based on these inputs, the RF controller 32 can select a frequency and signal the frequency generator 30 to output a signal indicative of the selected frequency. As represented pictorially in the block representing the frequency generator 30 in FIG. 2, the selected frequency determines a sinusoidal signal whose frequency ranges across a set of discrete frequencies. In one non-limiting example, a selectable bandwidth ranging from 2.4 GHz to 2.5 GHz can be discretized at a resolution of 1 MHz allowing for 101 unique frequency selections.

After the frequency generator 30, the signal is divided per output channel and directed to the phase generator 34. Each channel can be assigned a distinct phase, that is, the initial angle of a sinusoidal function. As represented pictorially in the block representing the per channel phase generator 36A-D in FIG. 2, the selected phase of the RF signal for a channel can range across a set of discrete angles. In one non-limiting example, a selectable phase (wrapped across half a cycle of oscillation or 180 degrees) can be discretized at a resolution of 10 degrees allowing for 19 unique phase selections per channel.

Subsequent to the phase generator 34, the RF signal per channel can be directed to the amplitude generator 38. The RF controller 32 can assign each channel (shown in FIG. 2 with a common frequency and distinct phase) to output a distinct amplitude in the channel 40A-D. As represented pictorially in the block representing the per channel amplitude generator in FIG. 2, the selected amplitude of the RF signal can range across a set of discrete amplitudes (or power levels). In one non-limiting example, a selectable amplitude can be discretized at a resolution of 0.5 decibels across a range of 0 to 23 decibels allowing for 47 unique amplitude selections per channel.

The amplitude of each channel 40A-D can be controlled by one of several methods depending upon the implementation. For example, control of the supply voltage of the amplitude generator 38 for each channel can result in an output amplitude for each channel 40A-D from the RF signal generator 16 that is directly proportional to the desired RF signal output for the respective high-power amplifier 18A-D. Alternatively, the per channel output can be encoded as a pulse-width modulated signal where the amplitude level is encoded by the duty cycle of the pulse width modulated signal. Yet another alternative is to coordinate the per channel output of the power supply 12 to vary the supply voltage supplied to each of the high-power amplifiers 18A-D to control the final amplitude of the RF signal transmitted to the enclosed cavity 20.

As described above, the electromagnetic cooking device 10 can deliver a controlled amount of power at multiple RF feeds 26A-D into the enclosed cavity 20. Further, by maintaining control of the amplitude, frequency and phase of the power delivered from each RF feed 26A-D, the electromagnetic cooking device 10 can coherently control the power delivered into the enclosed cavity 20. Coherent RF sources deliver power in a controlled manner to exploit the interference properties of electromagnetic waves. That is, over a defined area of space and duration of time, coherent RF sources can produce stationary interference patterns such that the electric field is distributed in an additive manner. Consequently, interference patterns can add to create an electromagnetic field distribution that is greater in amplitude than any of the RF sources (i.e. constructive interference) or less than any of the RF sources (i.e. destructive interference).

The coordination of the RF sources and characterization of the operating environment (i.e. the enclosed cavity and the contents within) can enable coherent control of the electromagnetic cooking and maximize the coupling of RF power with an object in the enclosed cavity 20. Efficient transmission into the operating environment can require calibration of the RF generating procedure. As described above, in an electromagnetic heating system, the power level can be controlled by many components including the voltage output from the power supply 12, the gain on stages of variable gain amplifiers including both the high-power amplifiers 18A-D and the amplitude generator 38, the tuning frequency of the frequency generator 30, etc. Other factors that affect the output power level include the age of the components, inter-component interaction and component temperature. Consequently, the function describing the output power of the overall RF chain is complex, particularly in a multiple feed RF system, and depends on many variables that can include variables that are not measurable. An RF system to control the power output from multiple RF feeds 26A-D can estimate this function by a calibration procedure and then use the calibration estimate to determine actuation settings for a desired output power level.

Calibration information to describe the output power function can be stored in a look-up table (LUT). A LUT is a data array that replaces runtime computation with a simpler array indexing operation. The LUT can include data that characterizes, per RF feed 26A-D of the multiple feed RF system, the gain of any of the components, an interpolation function, a baseline (or factory settings) calibration determined at the time of manufacture or assembly for the components, and an updated calibration further refined by an interpolation function, or any combination of these characteristics. In this way, the information in the LUT can identify the relationship between a control variable and the output power of the system. In other words, the LUT describes how control variables like frequency, phase, voltage from the power supply 12 and/or pulse-width modulation affect the output power at the RF feeds 26A-D. Then, when in operation, the controller 14 can determine an optimal output power and invert the relationship described by the LUT to determine the settings for the control variables to achieve the desired output power.

For the output power level at the end of the amplification stage to hit a desired set-point level, the RF signal generator 16 relies on feedback in the form of signals indicative of the forward and backward power levels determined by the high-power amplifiers 18A-D. Therefore, in addition to the amplifying components for outputting a radio frequency signal that is amplified in power with respect to an input radio frequency signal, the high-power amplifiers 18A-D include a measuring component that outputs a signal indicative of the radio frequency power transmitted and received by the amplifying component. The measuring component of a high-power amplifier typically includes an analog-to-digital convertor (ADC) such that the output signal is digital and readily input to a device such as the RF signal generator 16. The measuring component for the high-power amplifiers 18A-D can be any component useful for the measurement of radio frequency signals including, but not limited to, radio frequency log power detectors that provide a direct current output voltage that is log-linear with respect to the detected radio frequency power level.

Solid-state transistors used in high-power amplifiers are non-linear devices. Being active radio frequency components, the gain of a high-power amplifier is a function of a number of measurable and not measurable factors such as oscillating frequency, temperature, aging, etc. The high-power amplifiers 18A-D require some form of factory calibration such that the output signal from the measuring component can be converted into a power measurement. For example, with a radio frequency log power detector, the output voltage is digitized and the resulting value is converted into a power level by using calibration coefficients. The calibration coefficients are determined during a factory calibration process and stored in nonvolatile memory such as Electrically Erasable Programmable Read-Only Memory (EEPROM).

Figure 3:
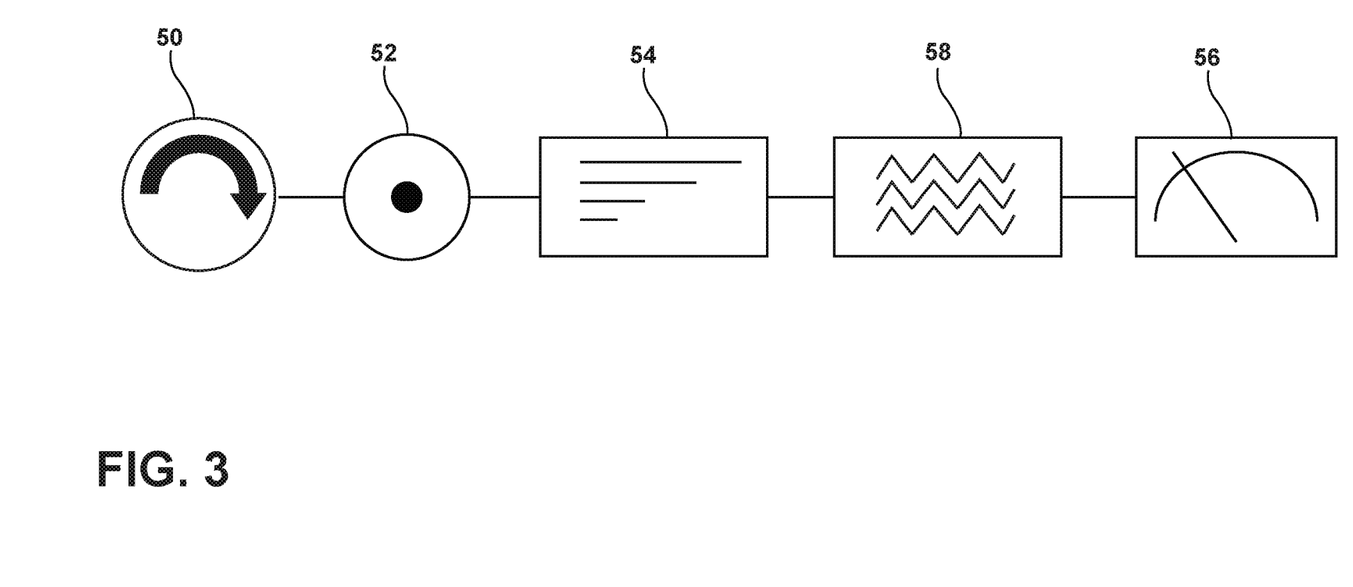
FIG. 3 is a block diagram illustrating the components used for calibrating a high-power amplifier in accordance with various aspects described herein.

Referring now to FIG. 3, a block diagram illustrating the components used for calibrating a high-power amplifier in accordance with various aspects described herein is shown. Relevant components of the high-power amplifier include a circulator 50 coupled to an RF connector 52, which allows connection to external components such as a variable phase connection 54, which is coupled to a dummy load 58, which, in turn, is coupled to a power meter 56.

The circulator 50 is a passive multi-port component that transmits radio frequency signals from one port to the next. A port is point on the circulator 50 for coupling a radio frequency signal from one component to another. The RF connector 52 is coupled to one of the ports of the circulator 50 and can be any type of RF connector including, but not limited to, a waveguide, a microstrip line, a coaxial cable, an N-type connector, etc.

The variable phase connection 54 provides a variable phase load useful for determining phase error calibration. The variable phase connection 54 can be any component useful for introducing a known phase offset to the radio frequency signal including, but not limited to, a set of cables of varying electrical lengths, each electrical length measured with a vector network analyzer (VNA).

The dummy load 58 is a resistive element used in place of a waveguide or antenna to aid in the calibration process. The calibration process includes connecting an external RF power meter 56 to the dummy load 58. In order to calibrate the high-power amplifier's integrated power measuring component to the accuracy of the external RF power meter 56, one or more power levels are set on the amplifier, and measurements from the RF power meter 56 and the voltage from the RF detector of the measuring component are collected. The calibration process can be repeated with a variable phase load via the variable phase connection 54 to reduce calibration errors.

Figure 4:
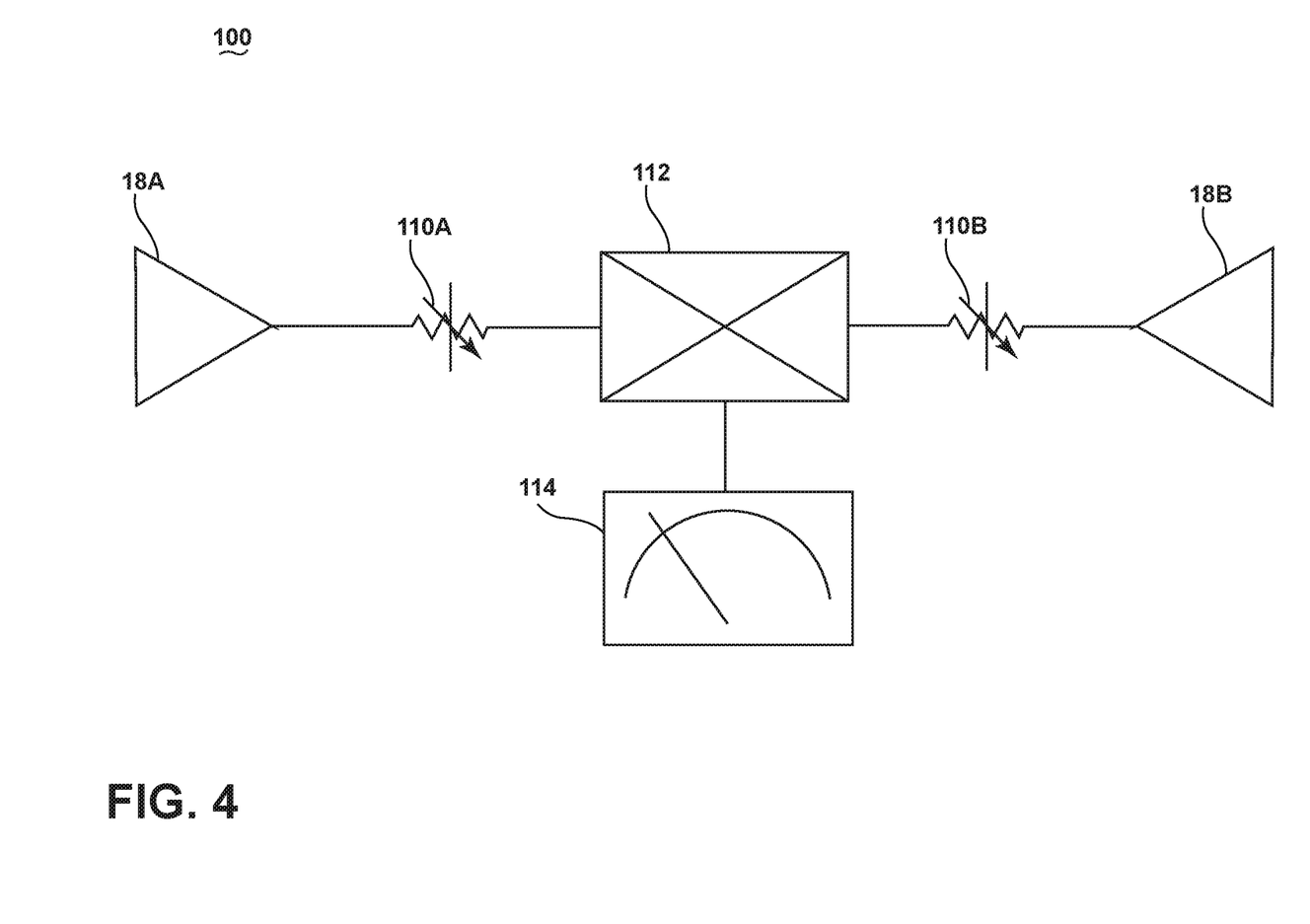
FIG. 4 is a schematic diagram illustrating a system for calibrating two high-power radio frequency amplifiers in accordance with various aspects described herein.

Referring now to FIG. 4, a schematic diagram illustrating a system 100 for calibrating two high-power radio frequency amplifiers 18A, B in accordance with various aspects described herein is shown. The high-power amplifiers 18A, B are placed in opposition such that the RF power outputs are facing each other. Each high-power amplifier 18A, B is coupled to an attenuator 110A, B respectively, via RF connectors and variable phase connections. Each attenuator 110A, B is coupled to a bidirectional coupler 112 which, in turn, is also coupled to a two-channel RF power meter 114. RF power meter 114 may be coupled to an external processor 120, which in turn may be coupled to controller 14. Alternatively, RF power meter 114 may be directly coupled to controller 14.

The attenuators 110A, B are passive electrical components that include a configuration of resistors that reduce the power of a radio frequency signal. The attenuators 110A, B scale the power level of the radio frequency signal output from the high-power amplifiers 18A, B down to a level appropriate for measuring with the two-channel RF power meter 114.

The bidirectional coupler 112 is a passive component that couples a defined amount of radio frequency power to a port enabling the radio frequency signal to be used in another circuit such as the two-channel RF power meter 114. As shown in FIG. 4, attenuated RF power from each of the attenuators 110A, B enters the bidirectional coupler 112 and is directed to the two-channel RF power meter 114. The two-channel RF power meter 114 can simultaneously measure an RF power level from both high-power amplifiers 18A, B.

Figure 5:
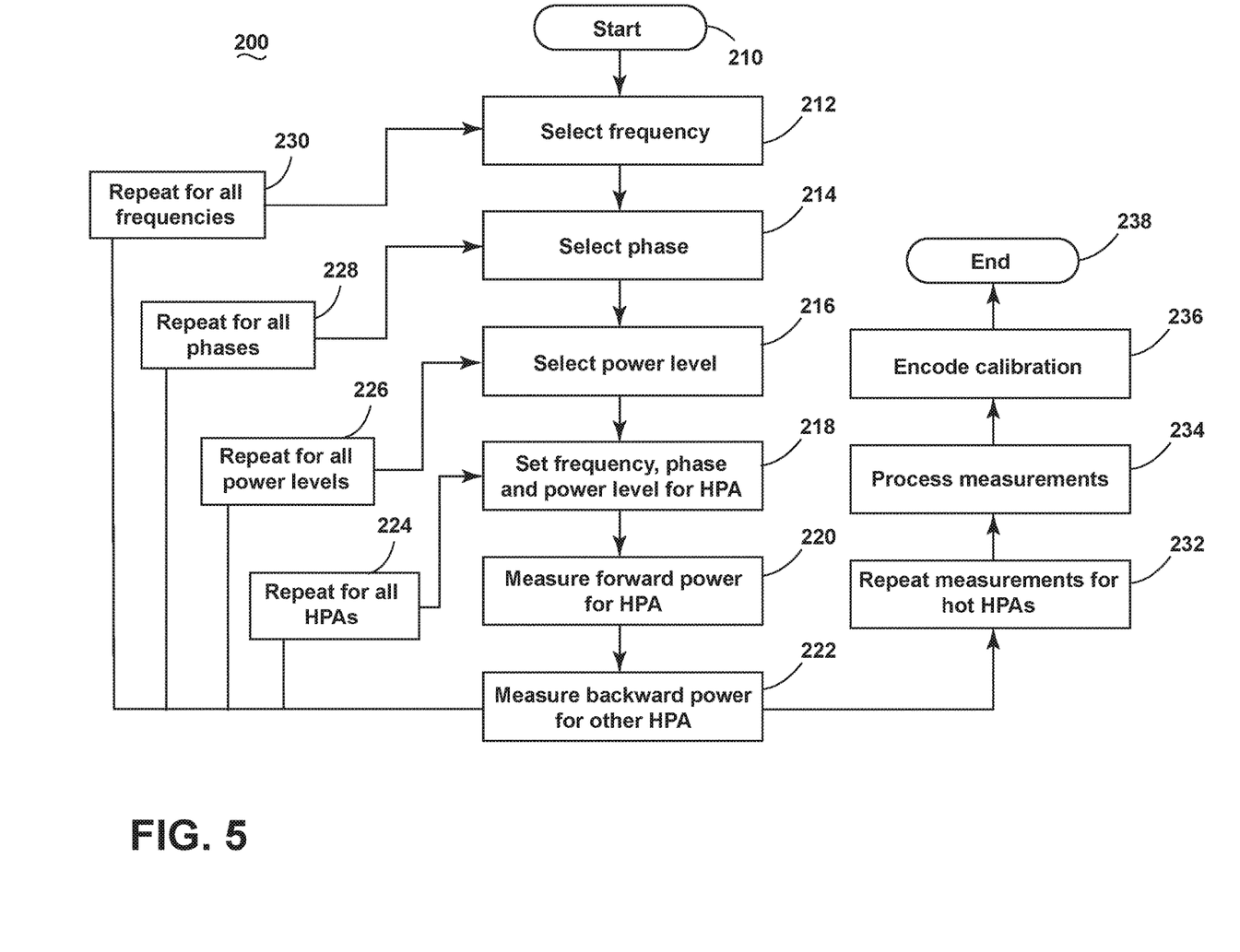
FIG. 5 is flowchart illustrating a method for calibrating a set of high-power radio frequency amplifiers in accordance with various aspects described herein.

Referring now to FIG. 5, a flowchart illustrating a method for calibrating a set of high-power radio frequency amplifiers configured according to FIG. 4 and in accordance with various aspects described herein is shown. The start of the calibration, at step 210, can occur during the manufacture of the electromagnetic cooking device. Initially, as shown in FIG. 4, a set of high-power amplifiers 18A, B are placed in opposition such that the radio frequency outputs are facing each other using system 100 and other internal components such as controller 14. At step 212, a frequency is selected from a set of frequencies in a bandwidth of radio frequency electromagnetic waves. The set of frequencies can be any number of frequencies within the operable bandwidth of the high-power amplifier. In one non-limiting example, the set of frequencies includes the ISM frequencies 2401 MHz, 2440 MHz and 2482 MHz.

At step 214, a phase value is selected from a set of phase values of radio frequency electromagnetic waves. The set of phase values can be any number of phases ranging across a wrapped phase range of −180 to 180 degrees. In one non-limiting example, the set of phases includes two phase values each corresponding to a cable of different electrical length as shown by the variable phase connection 54 in FIG. 3.

At step 216, a power level is selected from a set of power levels. The set of power levels can be any number of power levels ranging across the operable power range for the high-power amplifiers 18A, B. In one non-limiting example, the set of power levels includes three power levels: 54 dBm, 51 dBm, and 45 dBm.

At step 218, one of the high-power amplifiers is set to output a radio frequency signal of the selected frequency, the selected phase value and the selected power level. The high-power amplifier then outputs a radio frequency signal. The measuring component internal to each of the high-power amplifiers 18A, B generates a digital signal indicative of detected radio frequency power. Steps 212-218 may be performed by controller 14 either in direct response to an input calibration instruction or in response to an instruction from an external processor 120.

At step 220, the external two-channel RF power meter 114 measures a forward power level for the transmitting high-power amplifier that is outputting the radio frequency signal. Concurrently, at step 222, the external RF power meter 114 measures a backward power for the high-power amplifier that is not outputting the radio frequency signal. The measured values may be stored in the external processor 120 and/or the controller 14.

At step 224, the steps 218, 220 and 222 are repeated where the previously transmitting high-power amplifier stops transmitting and the previously non-transmitting high-power amplifier is set to transmit.

At step 226, the steps 216, 218, 220, 222 and 224 are repeated for all of the power levels in the set of power levels. Using the example above where the set of power levels includes the three power levels 54 dBm, 51 dBm and 45 dBm, the two-channel power meter 114 measures 12 values that correspond to three forward measurements for each high-power amplifier 18A, B and three backward measurements for each high-power amplifier 18A, B.

At step 228, the steps 214, 216, 218, 220, 222, 224 and 226 are repeated for all of the phase values in the set of phase values. At step 230, the steps 212, 214, 216, 218, 220, 222, 224, 226 and 228 are repeated for all of the frequencies in the set of frequencies.

At step 232, all of the measurements are repeated after the high-power amplifiers 18A, B warm up. The ADC of the measuring component in the high-power amplifier is non-linear in temperature. Therefore, the entire calibration measurement process is repeated when the high-power amplifiers are hot.

At step 234, the measurements of the forward and backward power levels are processed by an external processor 120 or controller 14 to calibrate the digital signal output from the measuring component of each of the high-power amplifiers. The processing can include operations to model and fit the data, including but not limited to averaging and least-square fitting. The results of the processing can include generating a set of calibration coefficients such that the ADC of the measuring component of each high-power amplifier outputs a value that can be converted into an accurate power measurement. The number of coefficients can be any number needed to convert the digital output of the ADC to a power level with a desired level of fidelity. In one non-limiting example, the number of calibration coefficients is two where one of the coefficients is a slope and the other is an intercept.

At step 236, the calibrated digital signal output is encoded into non-volatile memory located on each of the high-power amplifiers. That is, the calibration coefficients are uploaded to read-only memory accessible by the high-power amplifier. Each high-power amplifier may thus have its own unique calibration coefficients.

The calibration of multiple high power amplifiers determines the overall effectiveness, the tunability and coherence of the electromagnetic fields in the solid-state radio frequency (RF) cooking appliance. Benefits of the calibration method and system described above include a measurement system configured and operated such that electromagnetic discontinuities that are the source of calibration errors are cancelled or minimized to increase the accuracy of the high-power amplifier calibration and overall efficiency of the RF chain.

Although external components are described as part of the calibration system 100, it will be appreciated that such external components may be integrated into the electromagnetic cooking device, and therefore, be internal components.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the device as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structures and methods without departing from the concepts of the present device, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above is merely for illustrative purposes and not intended to limit the scope of the device, which is defined by the following claims as interpreted according to the principles of patent law, including the Doctrine of Equivalents.

What is claimed is:

1. A method for calibrating a set of devices, each device comprising an amplifying component configured to output a signal that is amplified in power with respect to an input radio frequency signal and a measuring component that outputs a digital signal indicative of radio frequency power detected at the amplifying component, the method comprising:
    selecting a frequency from a set of frequencies in a bandwidth of radio frequency electromagnetic waves;
    selecting a phase value from a set of phase values of the radio frequency electromagnetic waves;
    selecting a power level from a set of power levels;
    setting a subset of the set of devices to output a radio frequency signal of the selected frequency, the selected phase value and the selected power level and thereby also setting a different subset of the set of devices to not output a radio frequency signal;
    measuring a forward power level for the subset of the set of devices that is outputting the radio frequency signal;
    measuring a backward power level for the different subset of the set of devices that is not outputting the radio frequency signal;
    repeating the setting and measuring steps for each power level in the set of power levels;
    processing the measurements of the forward and backward power levels to calibrate the digital signal output from the measuring component of each of the set of devices; and
    encoding the calibrated digital signal output into non-volatile memory.

2. The method of claim 1 further including an initial step of configuring the set of devices such that the output radio frequency signal from each member of the set of devices is directed towards all the other members of the set of devices.

3. The method of claim 1 wherein the set of devices includes two high-power amplifiers.

4. The method of claim 1 further including a step of repeating the setting and measuring steps for each phase value in the set of phase values.

5. The method of claim 4 further including a step of repeating the setting and measuring steps for each frequency in the set of frequencies.

6. The method of claim 1 wherein the step of selecting a phase value includes configuring a cable of measured electrical length to provide a variable phase load.

7. The method of claim 1 wherein the set of power levels is 54 dBm, 51 dBm and 45 dBm.

8. The method of claim 1 wherein the set of frequencies is 2401 MHz, 2440 MHz and 2482 MHz.

9. The method of claim 1 wherein the processing of the measurements generates a set of calibration coefficients such that the digital signal of the measuring component of each of the set of devices outputs a value that can be converted into a power measurement.

10. An electromagnetic cooking device comprising:
    an enclosed cavity;
    a set of radio frequency (RF) feeds in the enclosed cavity configured to heat up and prepare food by introducing electromagnetic radiation into the enclosed cavity;
    a set of high-power RF amplifiers coupled to the set of RF feeds, each high-power amplifier comprising an amplifying component configured to output a signal that is amplified in power with respect to an input radio frequency signal and a measuring component configured to output a digital signal indicative of radio frequency power detected at the amplifying component; and
    a controller configured to calibrate the electromagnetic cooking device by:
        selecting a frequency from a set of frequencies in a bandwidth of radio frequency electromagnetic waves;
        selecting a phase value from a set of phase values of the radio frequency electromagnetic waves;
        selecting a power level from a set of power levels;
        setting a subset of the set of high-power RF amplifiers to output a radio frequency signal of the selected frequency, the selected phase value and the selected power level and thereby setting a different subset of the high-power RF amplifiers to not output a radio frequency signal;

the controller further configured to receive from a power meter:
  a measurement of a forward power level for the subset of the set of high-power RF amplifiers that is outputting the radio frequency signal;
  a measurement of a backward power level for the different subset of the set of high-power RF amplifiers that is not outputting the radio frequency signal;
  wherein the controller is further configured to repeatedly set and measure for each frequency in the set of frequencies and to process the measurements of the forward and backward power levels to calibrate the digital signal output from the measuring component of each of the set of high-power RF amplifiers and encode the calibrated digital signal output into non-volatile memory.

11. The electromagnetic cooking device of claim 10 wherein the set of high-power RF amplifiers are configured such that the output radio frequency signal from each member of the set of high-power RF amplifiers is directed towards all the other members of the set of high-power RF amplifiers.

12. The electromagnetic cooking device of claim 10 wherein the set of high-power amplifiers includes two high-power amplifiers.

13. The electromagnetic cooking device of claim 10 wherein the controller is further configured to repeatedly set and measure for each power level in the set of power levels.

14. The electromagnetic cooking device of claim 10 wherein the controller is further configured to repeatedly set and measure for each phase value in the set of phase values.

15. The electromagnetic cooking device of claim 10 wherein the controller is configured to select a power level from the set of power levels including 54 dBm, 51 dBm and 45 dBm.

16. The electromagnetic cooking device of claim 10 wherein the controller is configured to select a frequency from the set of frequencies including 2401 MHz, 2440 MHz and 2482 MHz.

17. The electromagnetic cooking device of claim 10 wherein the controller is configured to process the measurements to generate a set of calibration coefficients such that the digital signal of the measuring component of each high-power RF amplifier outputs a value that can be converted into a power measurement.

18. An electromagnetic cooking device comprising:
  an enclosed cavity;
  a set of radio frequency feeds in the enclosed cavity configured to heat up and prepare food by introducing electromagnetic radiation into the enclosed cavity;
  a set of high-power radio frequency (RF) amplifiers coupled to the set of RF feeds, each high-power RF amplifier comprising an amplifying component configured to output a signal that is amplified in power with respect to an input radio frequency signal and a measuring component configured to measure the magnitude of the forward and the backward power levels at the amplifier output; and
  a controller configured to calibrate the electromagnetic cooking device by causing a selected subset of the set of high-power RF amplifiers to output a radio frequency signal of a selected frequency, a selected phase value and a selected power level, and a different selected subset of the high-power RF amplifiers to not output a radio frequency signal, wherein the selected frequency is selected from a set of frequencies in a bandwidth of radio frequency electromagnetic waves, the selected phase value is selected from a set of phase values of the radio frequency electromagnetic waves, and the selected power level is selected from a set of power levels,
  wherein the controller further configured to calibrate the electromagnetic cooking device by repeatedly setting and measuring for each frequency in the set of frequencies and by processing measurements of forward and backward power levels to calibrate a digital signal output from the measuring component of each of the set of high-power RF amplifiers and encode the calibrated digital signal output into non-volatile memory such that a unique set of calibration coefficients are encoded for each high-power RF amplifier of the set of high-power RF amplifiers.

* * * * *